United States Patent
Li et al.

(10) Patent No.: US 9,224,415 B2
(45) Date of Patent: Dec. 29, 2015

(54) MICROPROBE, RECORDING APPARATUS, AND METHOD OF MANUFACTURING MICROPROBE

(75) Inventors: Yongfang Li, Tokyo (JP); Yasushi Tomizawa, Fuchu (JP); Akihiro Koga, Tokyo (JP); Gen Hashiguchi, Fussa (JP); Masakazu Sugiyama, Tokyo (JP)

(73) Assignees: Kabushiki Kaisha Toshiba, Minato-ku, Tokyo (JP); The University of Tokyo, Bunkyo-ku, Tokyo (JP)

( * ) Notice: Subject to any disclaimer, the term of this patent is extended or adjusted under 35 U.S.C. 154(b) by 1022 days.

(21) Appl. No.: 13/071,555

(22) Filed: Mar. 25, 2011

(65) Prior Publication Data
US 2012/0062213 A1    Mar. 15, 2012

(30) Foreign Application Priority Data
Sep. 10, 2010   (JP) .................................. 2010-203659

(51) Int. Cl.
| G01R 1/06 | (2006.01) |
| G11B 9/14 | (2006.01) |
| G01R 11/04 | (2006.01) |
| G01R 1/067 | (2006.01) |
| G01R 19/155 | (2006.01) |

(52) U.S. Cl.
CPC .............. *G11B 9/1418* (2013.01); *G01R 11/04* (2013.01); *G01R 1/06788* (2013.01); *G01R 19/155* (2013.01)

(58) Field of Classification Search
CPC ...... G11B 9/14; G11B 9/1409; G11B 9/1472; G06F 19/3406; G01R 1/06788; G01R 1/06777; G01R 11/04; G01R 19/155; G01R 19/145

USPC .................. 324/149, 760, 761, 762; 369/126, 369/13.17, 112.24, 300; 250/306; 251/11; 850/57

See application file for complete search history.

(56) References Cited

U.S. PATENT DOCUMENTS

| 4,161,437 | A | * | 7/1979 | Fleckenstein ................. 204/412 |
| 5,610,898 | A | * | 3/1997 | Takimoto et al. ............. 369/126 |
| 6,072,764 | A | * | 6/2000 | Shido et al. ................... 369/126 |
| 6,473,361 | B1 | * | 10/2002 | Chen et al. ..................... 365/244 |
| 6,894,272 | B2 | * | 5/2005 | Kranz et al. .................. 250/234 |
| 6,995,368 | B2 | * | 2/2006 | Wen et al. ..................... 250/306 |
| 7,176,457 | B2 | * | 2/2007 | Wen et al. ..................... 250/306 |
| 7,233,517 | B2 | * | 6/2007 | Rust .............................. 365/151 |
| 7,239,544 | B2 | * | 7/2007 | Chen et al. .................... 365/163 |
| 7,349,236 | B2 | * | 3/2008 | Lin et al. ....................... 365/129 |
| 7,910,390 | B2 | * | 3/2011 | Pavlov et al. ................... 438/52 |
| 8,045,444 | B2 | * | 10/2011 | Sebastian et al. ............. 369/126 |
| 8,331,212 | B2 | * | 12/2012 | Li et al. .......................... 369/126 |
| 8,988,065 | B2 | * | 3/2015 | Li et al. .......................... 324/149 |
| 2002/0137998 | A1 | * | 9/2002 | Smart et al. ................... 600/347 |

(Continued)

FOREIGN PATENT DOCUMENTS

JP        2011159350 A   *   8/2011

*Primary Examiner* — Patrick Assouad
*Assistant Examiner* — Sean Curtis
(74) *Attorney, Agent, or Firm* — Ohlandt, Greeley, Ruggiero & Perle, L.L.P.

(57) ABSTRACT

According to one embodiment, a microprobe includes a supporting base, an insulating layer, and an electrode layer arrayed in a first direction in this order. A principal surface of the microprobe is formed in a second direction different from the first direction. A step is formed on at least the electrode layer on the principal surface, and the electrode layer is partitioned into a first area and a second area by the step.

18 Claims, 6 Drawing Sheets

(56) References Cited

U.S. PATENT DOCUMENTS

| | | | |
|---|---|---|---|
| 2004/0105380 A1* | 6/2004 | Cho et al. | 369/126 |
| 2005/0082474 A1* | 4/2005 | Wen et al. | 250/306 |
| 2005/0092709 A1* | 5/2005 | Chun et al. | 216/13 |
| 2005/0179458 A1* | 8/2005 | Chen et al. | 324/762 |
| 2005/0189958 A1* | 9/2005 | Chen et al. | 324/762 |
| 2005/0212539 A1* | 9/2005 | Chen et al. | 324/754 |
| 2006/0016986 A1* | 1/2006 | Wen et al. | 250/306 |
| 2006/0023606 A1* | 2/2006 | Lutwyche et al. | 369/100 |
| 2007/0165512 A1* | 7/2007 | Harada et al. | 369/126 |
| 2007/0274193 A1* | 11/2007 | Akiyama et al. | 369/126 |
| 2008/0009763 A1* | 1/2008 | Chiou et al. | 600/544 |
| 2008/0149832 A1* | 6/2008 | Zorn | 250/311 |
| 2008/0229577 A1* | 9/2008 | Heck | 29/884 |
| 2009/0206953 A1* | 8/2009 | Pavlov et al. | 333/186 |
| 2009/0283867 A1* | 11/2009 | Chiou et al. | 257/615 |
| 2010/0331935 A1* | 12/2010 | Tabada et al. | 607/116 |
| 2011/0062594 A1* | 3/2011 | Maekawa et al. | 257/774 |
| 2011/0169517 A1* | 7/2011 | Kim et al. | 324/756.03 |
| 2011/0194398 A1* | 8/2011 | Li et al. | 369/126 |

* cited by examiner

MICROPROBE, RECORDING APPARATUS, AND METHOD OF MANUFACTURING MICROPROBE

CROSS-REFERENCE TO RELATED APPLICATIONS

This application is based upon and claims the benefit of priority from Japanese Patent Application No. 2010-203659, filed Sep. 10, 2010; the entire contents of which are incorporated herein by reference.

FIELD

Embodiments described herein relate generally to a microprobe used for, for example, a MEMS (Micro Electro Mechanical Systems) memory.

BACKGROUND

Studies have been made on probe-based MEMS memory using the principle of scanning probe microscopes (SPM). A probe-based MEMS memory is a recording apparatus which writes, reads out (reproduces), and erases information by using various electrical or physical interactions between the recording/reproducing electrode on the probe tip and a recording medium.

The state of the probe tip serving to record/reproduce information on/from a recording medium and the contact state or the gap between the probe tip and the recording medium greatly influence the recording performance of a probe-based MEMS memory. In order to commercialize the probe-based MEMS memory, it is important to easily fabricate the probes with excellent anti-wear resistance used for recording/reproduction at a low cost.

DETAILED DESCRIPTION

In general, according to one embodiment, a microprobe includes a supporting base, an insulating layer, and an electrode layer arrayed in a first direction in this order. A principal surface of the microprobe is formed in a second direction different from the first direction. A step is formed on at least the electrode layer on the principal surface, and the electrode layer is partitioned into a first area and a second area by the step.

Demands have arisen for a microprobe which allows a probe tip portion to be inexpensively and easily manufactured.

Each embodiment provides a microprobe having a supporting base, an insulating layer, and an electrode layer arrayed in the first direction in this order. On the principal surface of the microprobe which is formed in the second direction different from the first direction, a step is formed on at least the electrode layer. The step partitions the electrode layer into first and second areas.

An embodiment will be described below with reference to the views of the accompanying drawing. This embodiment is directed to a microprobe for, for example, a probe-based MEMS memory. The microprobe according to the embodiment has excellent abrasion resistance characteristics on the probe tip and can be inexpensively and easily manufactured. In addition, the microprobe according to the embodiment improves the contact state between the probe tip and a recording medium to increase the effective service life and stabilize recording characteristics.

Figures 1A, 1B:
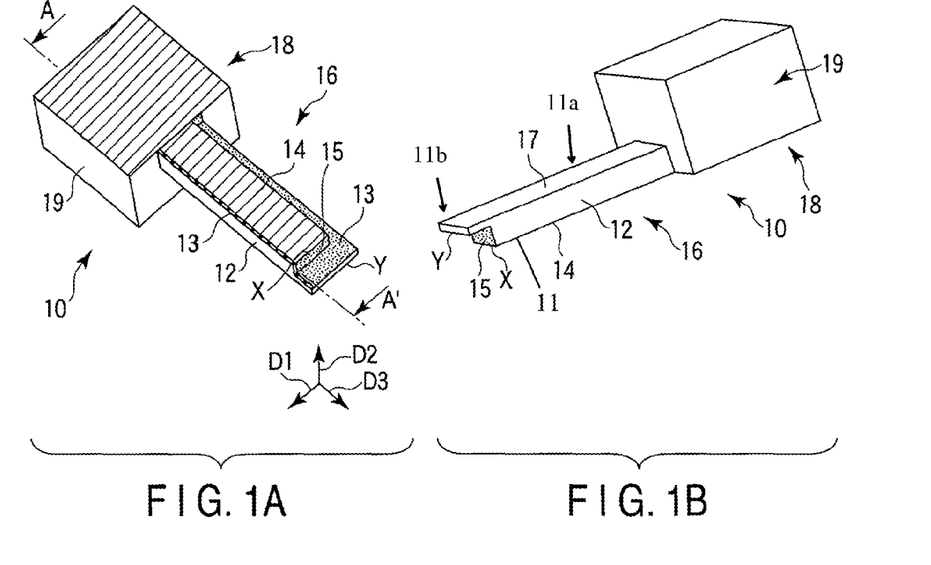
FIGS. 1A and 1B are perspective views of a microprobe according to the first embodiment.

FIGS. 1A and 1B are perspective views of the microprobe according to the first embodiment. FIG. 1A is a perspective view of the microprobe when viewed from the bottom direction. FIG. 1B is a perspective view of the microprobe when viewed from the top direction. The same reference numerals in the following views of the drawing denote the same constituent elements.

A microprobe 10 according to this embodiment serves to record/reproduce information on/from a recording medium, and has a supporting base 14, an insulating layer 13, and an electrode layer 12 arrayed in a first direction D1 in this order. A step 15 is formed on a principal surface 11 of the microprobe 10 which is formed in a second direction D2 different from the first direction D1. The step 15 partitions the electrode layer 12 into the first and second areas 11a, 11b. The lengths of the step 15 and second area 11b in the second direction D2 are set to bring a first corner portion X formed on the first area 11a or the step 15 into contact with a recording medium and inhibit the second area from coming into contact with the recording medium.

Note that of the supporting base 14, the insulating layer 13, and the electrode layer 12, the supporting base 14 or the insulating layer 13 may have no step. In other words, a step is formed on at least the electrode layer 12. This step partitions the electrode layer 12 into the first and second areas 11a, 11b. As will be described later, the technical significance of the formation of the step 15 is that it is possible to deposit the electrode layer 12 having a large area easily at a low manufacturing cost in a manufacturing process, as shown in FIGS. 1A and 1B. Referring to FIG. 1B, the upper surface of a lever portion 16, i.e., the surface on the opposite side to the principal surface 11 described above, is coated with a lever electrode 17. The electrode layer 12 transfers electrical information to a support electrode 19 formed on the surface of a support base portion 18 via the lever electrode 17 of the lever portion 16.

Figure 2A:
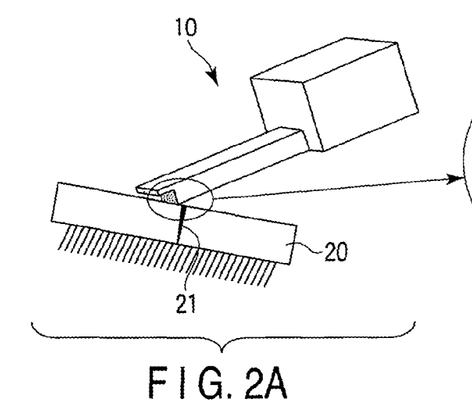
FIGS. 2A and 2B are views showing a state in which the microprobe is in contact with a recording medium.
Figure 2B:
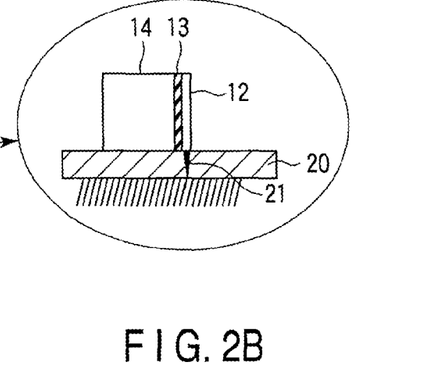

FIG. 2A shows a state in which the microprobe 10 according to this embodiment is in contact with a recording medium 20. FIG. 2B is an enlarged view of a portion where the microprobe 10 is in contact with the recording medium 20.

The electrode layer 12 is preferably made of a material which has good conductivity to transfer electrical information between the microprobe 10 and is harder than the supporting base 14 and the insulating layer 13 and softer than the medium 20. For example, as a material for the electrode layer 12, it is possible to use a material having high anti-wear resistance which is formed on the sidewall of the insulating layer 13 or the base 14, such as, W, Ru, Rh, Mo, or Cr. Using a hard material as the electrode layer 12 makes the electrode layer wear slower than the supporting base 14 and the insulating layer 13 in accordance with the hardness difference. This makes it easy for the electrode layer 12 to protrude, and hence prevents deterioration in contact with the recording medium 20 even when the base 14 and the insulating layer were worn.

As a material for the supporting base 14, it is possible to use Si, $SiO_X$, $SiN_X$, or the like which allows easy processing or shaping by a MEMS process. It is also possible to use Si, $SiO_X$, or $SiN_X$ as an insulating material. Therefore, using such a material as the same material for the supporting base 14 and the insulating layer 13 can integrate the supporting base 14 and the insulating layer 13.

When recording information on the recording medium 20 or reproducing information from the recording medium 20, the recording medium 20 or the probe 10 is moved relatively to the microprobe 10 or the recording medium. This relative moving direction is called a "probe scan direction". As shown in FIGS. 2A and 2B, when a voltage is applied to the microprobe 10 while the corner portion of the microprobe 10 is in contact with the recording medium 20, a recording bit 21 can be formed.

At the time of recording/reproduction, the microprobe 10 performs position control as follows.

For example, a first control unit 33 controls the position of the microprobe 10 to bring the first corner portion X of the supporting base 14 having the electrode layer 12 formed on a side surface into contact with the recording medium 20 before a second corner portion Y of the second area 11b (i.e., the tip of the microprobe 10) which protrudes in the longitudinal direction of the supporting base 14. That is, as is obvious from FIG. 2A, the first control unit 33 tilts the microprobe 10 at a proper angle relative to the recording surface of the recording medium 20 so as to bring the two portions into contact with the recording surface. This brings the first corner portion X of the supporting base 14 into contact with the recording medium 20, and simultaneously brings the electrode layer 12 into contact with the recording medium 20.

As is obvious from FIG. 1A, it is possible to form a step on a side wall of the microprobe 10 which is located on the opposite side to the electrode layer 12. This embodiment can reliably bring the electrode layer 12 into contact with the recording surface of the recording medium 20. This will be described with reference to FIG. 3.

Figure 3:
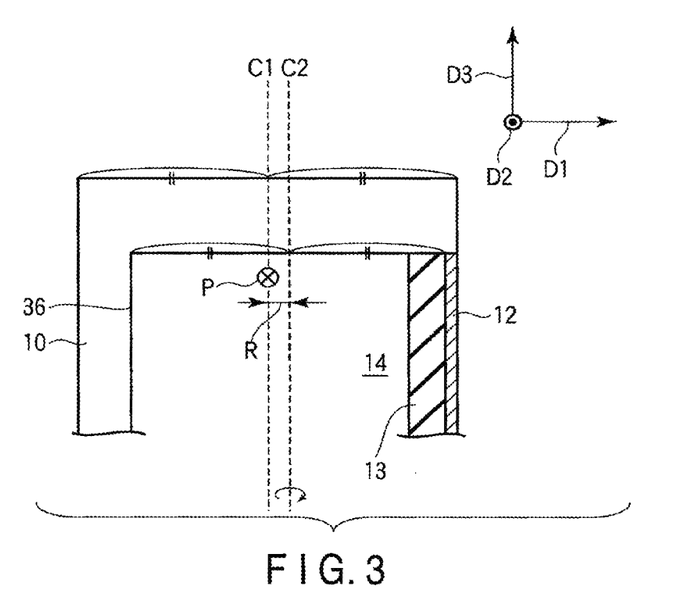
FIG. 3 is a view for explaining the relationship between forces acting on the microprobe.

When an actuator (not shown) brings the microprobe 10 into contact with the recording medium 20, a repulsive force F from the recording medium 20 acts on a point p of the microprobe 10, as shown in FIG. 3. The point p passes through a shape center axis C1 of the probe tip. In this case, since a step 36 is formed on a side wall of the microprobe 10 which is located on the opposite side to the electrode layer 12, a shape center axis C2 of the supporting base 14 is closer to the electrode layer 12 than the shape center axis C1 by a distance R. This generates torque $N = R \times F$ in the clockwise direction centered on the shape center axis C2. This torque acts in a direction to bring the electrode layer 12 of the microprobe 10 into contact with the recording medium 20, i.e., the second direction D2. It is therefore possible to reliably bring the electrode layer 12 of the microprobe 10 into contact with the recording surface of the recording medium 20, thus maintaining the stable recording/reproducing characteristics.

Figure 4:
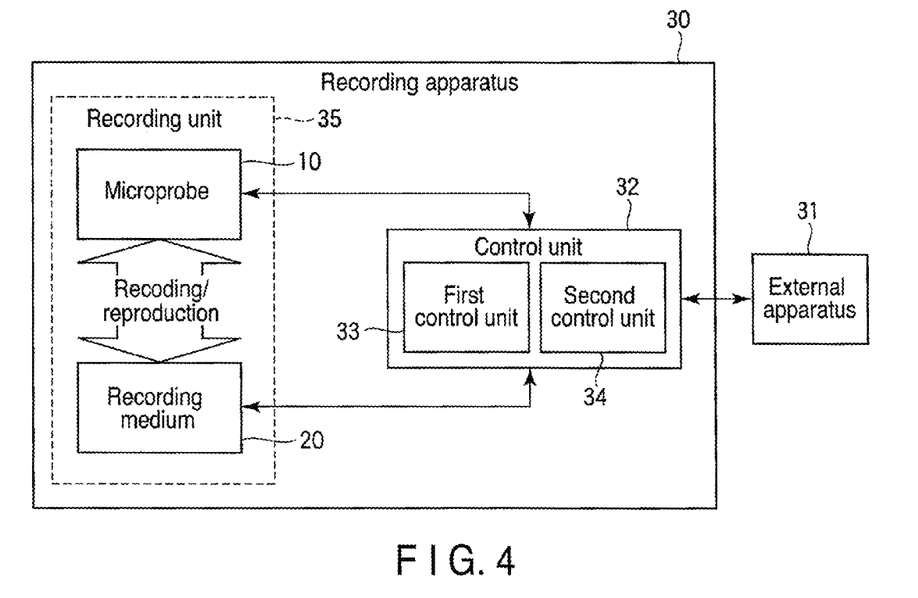
FIG. 4 is a block diagram showing a recording apparatus.

FIG. 4 is a block diagram showing a recording apparatus according to this embodiment. A recording apparatus 30 includes a control unit 32 connected to an external apparatus 31 and a recording unit 35. The control unit 32 includes the first control unit 33 and a second control unit 34. The recording unit 35 includes the microprobe 10 and the recording medium 20. The first control unit 33 controls the relative positions of the microprobe 10 and recording medium 20. The second control unit 34 records information on the recording medium 20 or reproduces information from the recording medium 20 by using the electrical interaction between the electrode layer 12 of the microprobe 10 and the recording medium 20. At the time of recording on the recording medium 20, the external apparatus 31 provides information to the control unit 32. When information is reproduced from the recording medium 20, the information is sent to the external apparatus 31 via the control unit 32.

FIGS. 5A, 5B, 5C, 5D, 5E, 5F, 5G, 5H, and 5I show an example of a manufacturing process for the microprobe 10 according to this embodiment. In trial manufacture, an SOI substrate 43 was used, which included a device layer 40 having a thickness of 10 μm, a box layer 41 having a thickness of 0.5 μm, and a handling layer 42 having a thickness of 380 μm.

Figure 5A:
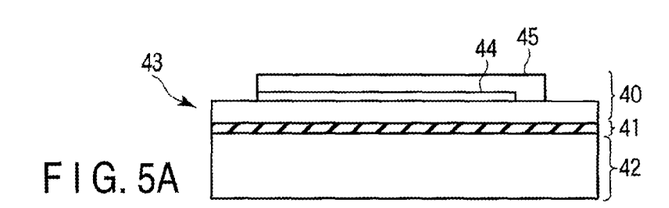
FIGS. 5A, 5B, 5C, 5D, 5E, 5F, 5G, 5H, and 5I are views showing an example of a manufacturing process for a microprobe.
Figure 5B:
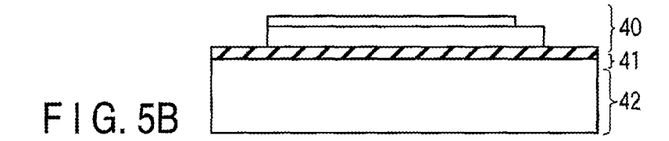
Figure 5C:
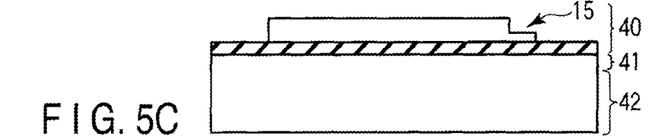
Figure 5D:
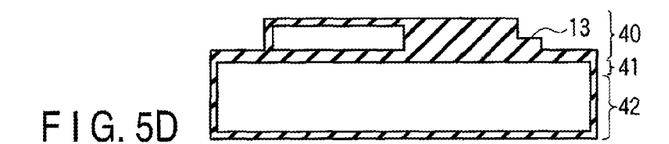

As shown in FIG. 5A, aluminum is deposited and patterned by an Al sputtering process, a lithography process and a wet etching process to form an aluminum mask 44 for the formation of the step 15 on the probe tip. Subsequently, a lithography step is executed again to produce a resist mask 45 for the formation of a probe shape. As shown in FIG. 5B, the shape of the microprobe 10 without any step on the distal end portion is obtained by a DRIE (Deep Reactive Ion Etching) process. As shown in FIG. 5C, the resist mask 45 is removed to expose the aluminum mask 44, and lithography process and DRIE process are executed again to form the step 15 on the probe tip. As shown in FIG. 5D, the aluminum mask 44 is removed, and a thermal oxidation step is performed to form the insulating layer 13.

Figure 5E:
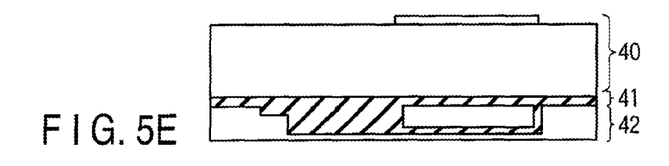
Figure 5F:
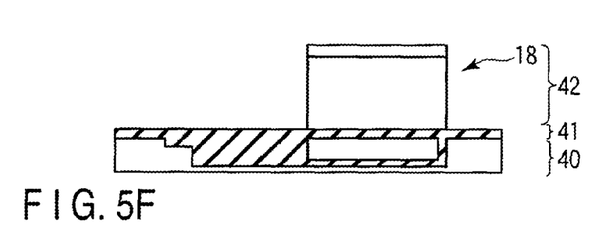
Figure 5G:
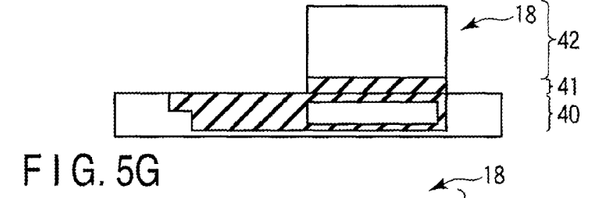

Subsequently, as shown in FIGS. 5E, 5F, and 5G, lithography and DRIE steps are executed again to form the support base portion 18 on the handling layer 42 of the SOI substrate 43.

As shown in FIG. 5E, after the device layer of the SOI substrate is protected by a resist, the SOI substrate 43 is turned over, and an aluminum mask for a support base is formed on the handling layer 42 of the SOI substrate 43 by an aluminum deposition process, a lithography process, and an aluminum etching process. Thereafter, as shown in FIG. 5F, the handling layer 42 is etched by DRIE process to form the support base portion 18. As shown in FIG. 5G, the box layer 41 on the SOI substrate 43 is then removed to release the microprobe 10.

Figure 5H:
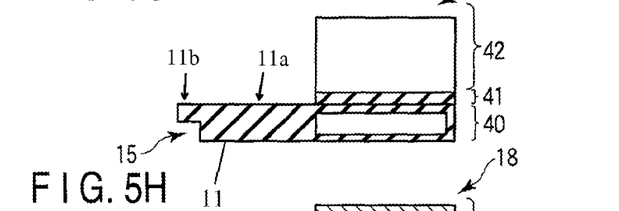

As shown in FIG. 5H, the protective resist applied to the device layer 40 of the SOI substrate 43 is removed. Note that FIG. 5H corresponds to a cross section taken along a line A-A' in FIG. 1A. Lastly, as shown FIG. 5I, the electrode layer 12 and the support electrode 19 are formed on the surface of the handling layer 42 of the SOI substrate 43 by a sputtering or vacuum deposition step. In this case, the sputtering or vacuum deposition direction corresponds to the surface on the opposite side to the principal surface 11 on which the step 15 is formed, i.e., the direction from the lower surface (the surface on the side where the support base portion 18 protrudes) to D2.

Figure 6A:
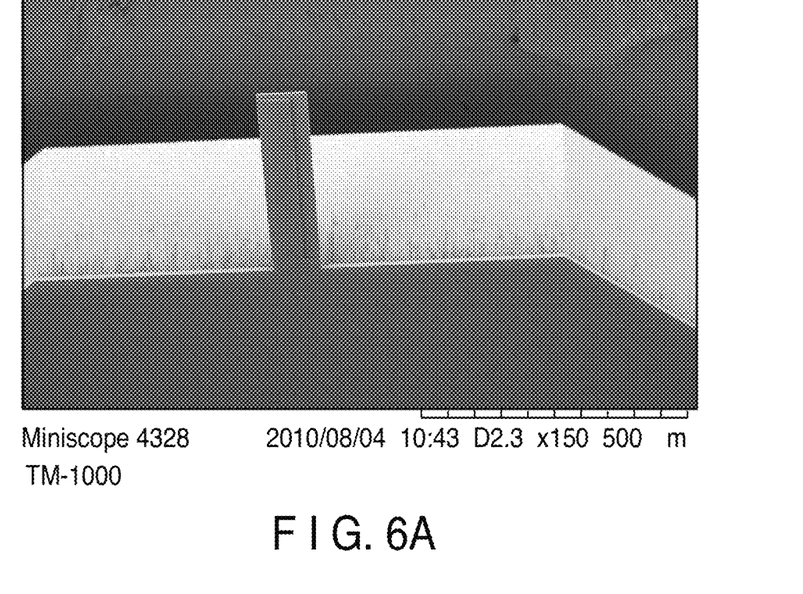
FIGS. 6A and 6B are views showing an example of a manufactured probe.
Figure 6B:
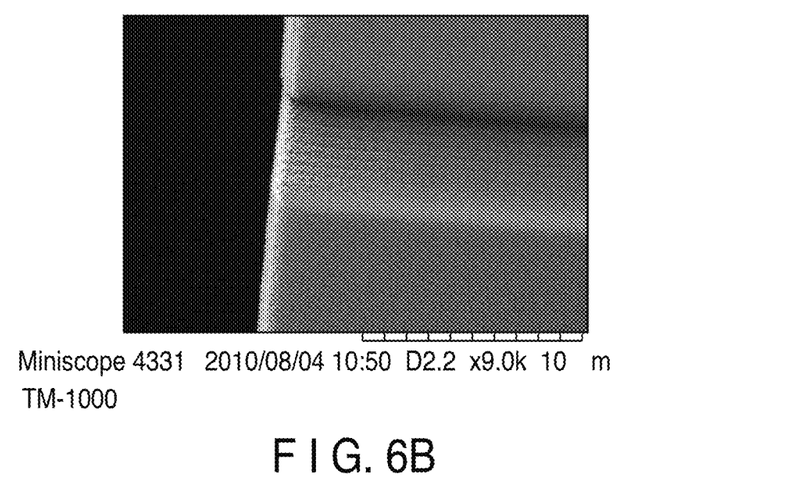

FIGS. 6A and 6B show an example of the microprobe manufactured in the above manner. FIG. 6A shows the overall microprobe including the support base portion. FIG. 6B is an enlarged view of the probe tip.

Figure 5I:
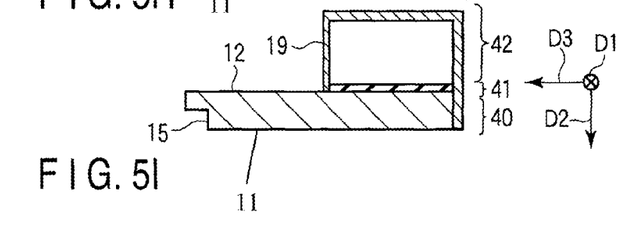

According to this embodiment, as shown in FIG. 5I, when sputtering or vacuum deposition is to be performed, since the step 15 is formed on the probe tip, the step 15 serves as an overhang to inhibit deposition on the principal surface 11 of the supporting base 14 and the first corner portion X. As a consequence, the electrode layer 12 is deposited on only a side wall of the probe tip on the outermost side. This makes it possible to easily deposit the electrode layer 12 so as to array the supporting base 14, the insulating layer 13, and the electrode layer 12 in the first direction D1 in this order. This requires no other microfabrication, and hence can suppress the manufacturing cost.

In addition, it is possible to reduce the width (thickness) of the electrode layer 12, which comes into electrical contact with the recording medium 20 between the distal end portion of the microprobe 10 and the recording medium 20, in the first direction D1 by the above manufacturing process. This makes it possible to reduce the size of the recording bit 21 shown in FIG. 2. Such fine recording bits 21 can realize high-density recording.

In addition, the supporting base 14, the insulating layer 13, and the electrode layer 12 are arrayed in the first direction D1 in this order, and their corner portions come into contact with the recording medium 20. This structure can prevent the repulsive force from the recording medium 20 at the time of contact of the microprobe 10 with the recording medium 20 from concentrating on only the electrode layer 12, and can disperse the repulsive force to the supporting base 14 and the insulating layer 13. It is therefore possible to suppress the abrasion of the electrode layer 12 without increasing the electrical contact area of the electrode layer 12 with the recording medium 20.

Assume that the material for the electrode layer 12 is harder than the material for the supporting base 14 and the insulating layer 13. In this case, even if abrasion occurs on the distal end of the microprobe 10, stable recording/reproducing characteristics can be maintained since the electrode layer 12 still protrudes and contacts with the medium 20. This can prolong the effective service life of the microprobe 10.

Second Embodiment

Figure 7A:
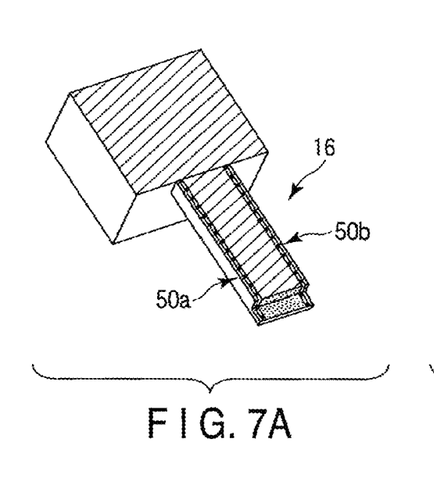
FIGS. 7A and 7B are perspective views of a microprobe according to the second embodiment.
Figure 7B:
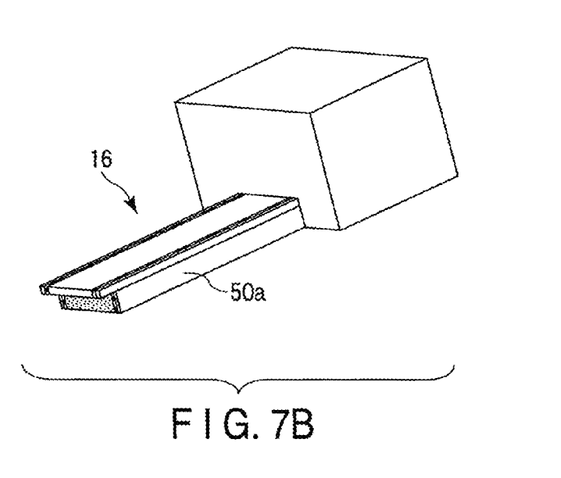

A microprobe 10 shown in FIG. 1 includes an electrode layer 12 on a side surface of a lever portion 16 (supporting base 14). The second embodiment has a structure including two electrode layers 50a and 50b on the both sidewall surfaces of the lever portion 16, as shown in FIGS. 7A and 7B. The second embodiment has the same effects as those of the first embodiment, and doubles the amount of information to be recorded/reproduced which can be handled by one microprobe because of the two electrode layers 50a and 50b on the distal end of the one microprobe.

Third Embodiment

Figure 8A:
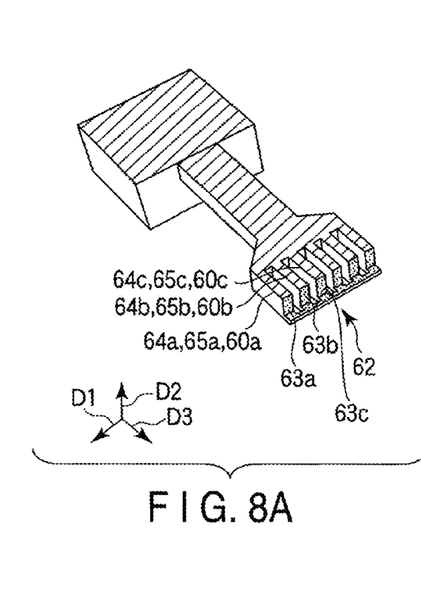
FIGS. 8A and 8B are perspective views of a microprobe according to the third embodiment.
Figure 8B:
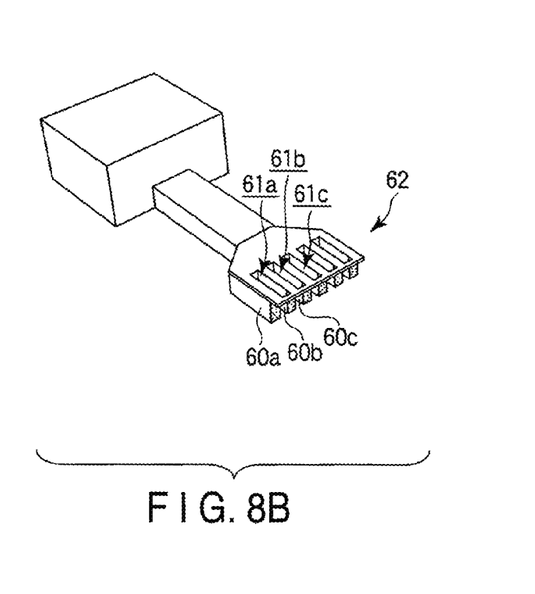

As shown in FIG. 8B, a plurality of slits 61a, 61b, 61c, . . . are formed in the distal end of a microprobe 62. The direction in which the slits 61a, 61b, 61c, . . . are formed is a first direction D1, which is the scan direction of the microprobe. In addition, as shown in FIG. 8A, a plurality of steps 63a, 63b, 63c, . . . are formed.

Subsequently, a supporting base 64a, an insulating layer 65a, and an electrode layer 60a are formed to be arrayed in the first direction in this order.

Likewise, a supporting base 64b, an insulating layer 65b, and an electrode layer 60b are formed to be arrayed in the first direction in this order. In addition, a supporting base 64c, an insulating layer 65c, and an electrode layer 60c are formed to be arrayed in the first direction in this order. The plurality of electrode layers 60a, 60b, 60c, . . . may be formed on side surfaces of the slits 61a, 61b, 61c, . . . in this manner.

According to this embodiment, the size of recording/reproduction information and recording density can be defined by the thickness of electrode layer and the arrangement intervals between the electrode layers 60a, 60b, 60c, . . . , respectively. In this case, reducing the thickness of the electrode layer and the pitch of the electrodes 60a, 60b, 60c, . . . can increase the recording density and the amount of information which can be written in a recording medium at once. Otherwise, by reducing Relative movement pitch of the probe and the recording media, the recording density can be increased, too.

The third embodiment greatly increases the amount of recording/reproduction information which can be handled by one microprobe as compared with the first and second embodiments.

Fourth Embodiment

Figures 9A, 9B:
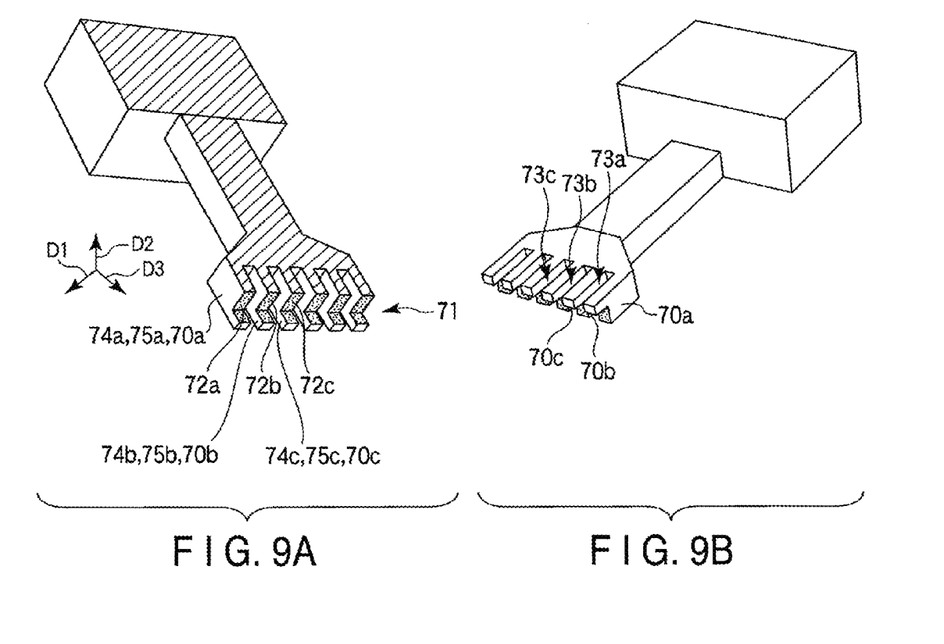
FIGS. 9A and 9B are perspective views of a microprobe according to the fourth embodiment.

As shown in FIG. 9B, the distal end of a microprobe 71 has a plurality of slits in the shape of a fork unlike in the third embodiment. The direction in which slits 73a, 73b, 73c, . . . are formed is the first direction D1, which is the scan direction of the microprobe. As shown in FIG. 9A, a plurality of steps 72a, 72b, 72c, . . . are formed.

A supporting base 74a, an insulating layer 75a, and an electrode layer 70a are formed to be arrayed in the first direction in this order. Likewise, a supporting base 74b, an insulating layer 75b, and an electrode layer 70b are formed to be arrayed in the first direction in this order. A supporting base 74c, an insulating layer 75c, and an electrode layer 70c are formed to be arrayed in the first direction in this order. In this manner, the plurality of electrode layers 70a, 70b, 70c, . . . may be formed on side surfaces of the slits 73a, 73b, 73c, . . .

According to this embodiment, the size of recording/reproduction information and recording density can be defined by the thickness of electrode layer and the arrangement intervals between the electrode layers 70a, 70b, 70c, . . . , respectively. In this case, reducing the thickness of the electrode layer and the pitch of the electrodes 70a, 70b, 70c, . . . can increase the recording density and the amount of information which can be written in a recording medium at once. Otherwise, by reducing Relative movement pitch of the probe and the recording media, the recording density can be increased, too.

Like the third embodiment, the fourth embodiment greatly increases the amount of recording/reproduction information which can be handled by one microprobe as compared with the first and second embodiments.

Fifth Embodiment

Figure 10:
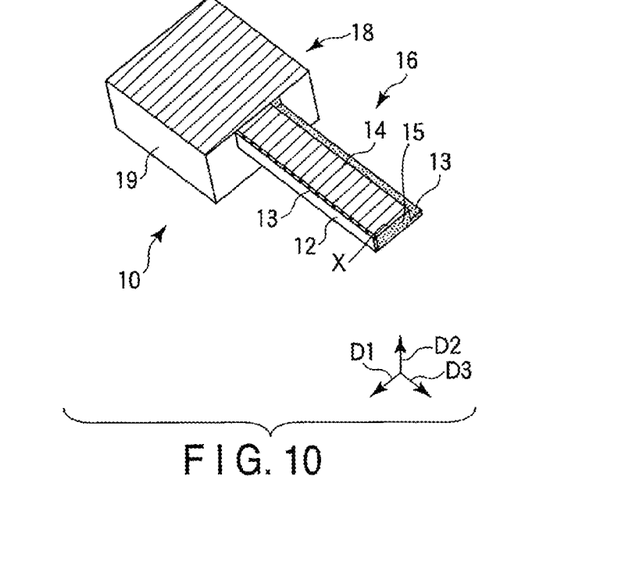
FIG. 10 is a perspective view of a microprobe according to the fifth embodiment.

The fifth embodiment is directed to a modification of the first to fourth embodiments described above. In the first to fourth embodiments described above, the step 15 is formed on at least the electrode layer 12 on the principal surface 11 of the microprobe 10. The step 15 partitions the electrode layer 12 into the first and second areas 11a, 11b, and the second area 11b forms a distal end portion of the microprobe 10. In contrast to this, in the fifth embodiment, as shown in FIG. 10, after an electrode layer 12 is deposited, the second area, i.e., the area protruding in a third direction D3, may be removed. In this case, an end portion of the step 15 forms an end portion of the microprobe 10. This can prevent the second corner portion Y formed on the second area from coming into contact with the recording medium 20 due to an operation error, impact, or the like. It is therefore possible to improve the stability of recording/reproducing characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A microprobe for a probe based MEMS memory system, comprising a supporting base, an insulating layer and an electrode layer arranged in a first direction, the insulating layer sandwiched between the supporting base and the electrode layer, wherein a principal surface of the microprobe is formed in a second direction perpendicular to that of the first direction, and wherein a step is formed on at least the electrode layer on the principal surface, and the electrode layer is partitioned into a first area and a second area by the step, wherein a probe tip of said microprobe is configured to contact a recording medium of the MEMS memory system.

2. The microprobe according to claim 1, wherein the electrode layer is formed from a material harder than materials of the supporting base and the insulating layer.

3. The microprobe according to claim 1, wherein the insulating layer comprises a plurality of insulating layers and the electrode layer comprises a plurality of electrode layers.

4. The microprobe according to claim 1, wherein one of the first area and the second area forms an end portion of the microprobe.

5. A recording apparatus for a probe based MEMS memory system comprising:
a microprobe comprising a supporting base, an insulating layer, and an electrode layer arrayed in a first direction in this order, wherein a principal surface of the microprobe is formed in a second direction perpendicular to that of the first direction, and wherein a step is formed on at least the electrode layer on the principal surface, and the electrode layer is partitioned into a first area and a second area by the step, a recording medium, wherein a probe tip of said microprobe contacts the recording medium of the probe-based MEMS memory system;
a first control unit configured to control a position of the recording medium relative to a position of the microprobe or control the position of the microprobe relative to the position of the recording medium; and
a second control unit configured to record information on the recording medium and reproduce information from the recording medium by using an electrical interaction between the electrode layer and the recording medium.

6. The apparatus according to claim 5, wherein lengths of the step and
the second area in the second direction are set to: bring a first corner portion formed on the first area or the step into contact with the recording medium; and
not to bring a second corner portion formed on the second area into contact with the recording medium.

7. The apparatus according to claim 5, wherein the first control unit controls relative positions of the recording medium and the microprobe to bring a first corner portion formed on the first area or the step into contact with the recording medium and not to bring a second corner portion formed on the second area into contact with the recording medium.

8. The recording apparatus according to claim 5, wherein the electrode layer is formed from a material harder than materials of the supporting base and the insulating layer.

9. The recording apparatus according to claim 5, wherein the insulating layer comprises a plurality of insulating layers and the electrode layer comprises a plurality of electrode layers.

10. The recording apparatus according to claim 5, wherein one of the first area and the second area forms an end portion of the microprobe.

11. The apparatus according to claim 8, wherein lengths of the step and the second area in the second direction are set to:
bring a first corner portion formed on the first area or the step into contact with the recording medium; and
not to bring a second corner portion formed on the second area into contact with the recording medium.

12. The apparatus according to claim 8, wherein the first control unit controls relative positions of the recording medium and the microprobe to bring a first corner portion formed on the first area or the step into contact with the recording medium and not to bring a second corner portion formed on the second area into contact with the recording medium.

13. The apparatus according to claim 9, wherein lengths of the step and the second area in the second direction are set to:
bring a first corner portion formed on the first area or the step into contact with the recording medium; and
not to bring a second corner portion formed on the second area into contact with the recording medium.

14. The apparatus according to claim 9, wherein the first control unit controls relative positions of the recording medium and the microprobe to bring a first corner portion formed on the first area or the step into contact with the recording medium and not to bring a second corner portion formed on the second area into contact with the recording medium.

15. The apparatus according to claim 10, wherein lengths of the step and the second area in the second direction are set to:
bring a first corner portion formed on the first area or the step into contact with the recording medium; and
not to bring a second corner portion formed on the second area into contact with the recording medium.

16. The apparatus according to claim 10, wherein the first control unit controls relative positions of the recording medium and the microprobe to bring a first corner portion formed on the first area or the step into contact with the recording medium and not to bring a second corner portion formed on the second area into contact with the recording medium.

17. A method of manufacturing a microprobe of a probe-based MEMS memory system, the method comprising:
forming an insulating layer on the sidewall of a supporting base;
forming a step on a principal surface of the supporting base formed in a direction perpendicular to a direction in which the insulating layer is formed, so as to partition the principal surface into a first area and a second area; and
forming an electrode layer on at least the sidewall of the insulating layer by performing sputtering or vapor deposition from a rear side of the principal surface.

18. The method according to claim 17, wherein after the electrode layer is formed, one of the first area and the second area is removed.

\* \* \* \* \*